(12) United States Patent
McMillan

(10) Patent No.: US 6,203,619 B1
(45) Date of Patent: Mar. 20, 2001

(54) MULTIPLE STATION APPARATUS FOR LIQUID SOURCE FABRICATION OF THIN FILMS

(75) Inventor: Larry D. McMillan, Colorado Springs, CO (US)

(73) Assignee: Symetrix Corporation, Colorado Springs, CO (US)

( * ) Notice: Subject to any disclaimer, the term of this patent is extended or adjusted under 35 U.S.C. 154(b) by 0 days.

(21) Appl. No.: 09/179,121

(22) Filed: Oct. 26, 1998

(51) Int. Cl.[7] .................................................. C23C 16/00
(52) U.S. Cl. ........................... 118/719; 118/50; 118/50.1; 118/629
(58) Field of Search ..................................... 118/305, 323, 118/50, 50.1, 326, 629, 718, 719; 414/935; 427/421

(56) References Cited

U.S. PATENT DOCUMENTS

| | | |
|---|---|---|
| 3,853,091 | 12/1974 | Christensen et al. . |
| 4,625,678 | 12/1986 | Shioya et al. . |
| 4,951,603 | 8/1990 | Yoshino et al. . |
| 5,002,011 | 3/1991 | Ohmine et al. . |
| 5,091,217 | 2/1992 | Hey et al. . |
| 5,288,379 * | 2/1994 | Namiki et al. ................... 204/192.12 |
| 5,302,209 | 4/1994 | Maeda et al. . |
| 5,338,362 * | 8/1994 | Imahashi ............................... 118/719 |
| 5,456,945 | 10/1995 | McMillan et al. . |
| 5,648,114 | 7/1997 | Paz de Araujo et al. . |
| 5,679,165 | 10/1997 | Maeda et al. . |
| 5,743,965 * | 4/1998 | Nishimura et al. ................... 118/712 |
| 5,788,454 | 8/1998 | Thompson et al. . |
| 5,846,328 * | 12/1998 | Aruga et al. .......................... 118/718 |
| 5,951,770 * | 9/1999 | Perlov et al. ......................... 118/719 |
| 5,997,642 * | 12/1999 | Solayappan et al. ................... 118/50 |

* cited by examiner

Primary Examiner—Timothy Meeks
Assistant Examiner—Jennifer Calcagni
(74) Attorney, Agent, or Firm—Duft, Graziano & Forest, P.C.

(57) ABSTRACT

An apparatus and method are disclosed for fabricating thin films for use in an active component of an integrated circuit by the use of an assembly line type process. A plurality of substrate stations are located on a platen which is rotated to move each station sequentially between a misted deposition device, a drying device, and a solidification device. The misted deposition device includes a mist showerhead in a movable housing. The mist showerhead separates a velocity reduction chamber from a deposition chamber.

20 Claims, 13 Drawing Sheets

MULTIPLE STATION APPARATUS FOR LIQUID SOURCE FABRICATION OF THIN FILMS

BACKGROUND OF THE INVENTION

1. Field of the Invention

The invention relates to apparatus and methods that more efficiently fabricate thin films for use in the active components of integrated circuits, and more particularly, such apparatus and methods employing misted liquid deposition devices and techniques.

2. Statement of the Problem

The formation of thin films of complex chemical compounds such as metal oxides, ferroelectrics, materials with high dielectric constants, and so on, is very important in the integrated circuit art. It is particularly difficult to form thin films for use in active components in integrated circuits; that is, components that perform an electrical function, such as charge storage or control, as opposed to materials that merely serve as temporary sacrificial layers or insulation or protective packaging for an integrated circuit. This difficulty arises from the fact that even minor microscopic defects can result in the loss of an entire device, and thus significantly decrease the yield and increase the cost of producing integrated circuits. Thus, the art of fabricating thin films for active components is a highly developed art with much ongoing research.

Some methods of forming thin films of complex chemical compounds for integrated circuits are: physical vapor deposition (PVD) techniques, such as thermal, electron beam, molecular beam epitaxy, laser ablation and sputtering; chemical vapor deposition (CVD); and misted deposition. See, for example, U.S. Pat. No. 5,648,114 issued Jul. 15, 1997, and U.S. Pat. No. 5,456,945 issued Oct. 10, 1995. All of these methods are used in commercial manufacturing systems, though they each have significant disadvantages. PVD techniques typically require a deposition environment of medium vacuum ($\sim 10^{-3}$ to 25 torr), high vacuum ($\sim 10^{-7}$ to $10^{-3}$ torr), or very high vacuum ($\sim 10^{-12}$ to $10^{-7}$ torr) to create or maintain an evaporate vapor, to prevent contamination from atmospheric gases, and/or to create sub-micron thin films. Such vacuums can be costly to create and maintain, and the corresponding vacuum pumps themselves have the potential of introducing contaminants (such as oil) into the deposition chambers unless additional preventative measures are introduced. Further, the physical necessity of pumping the vacuum chambers to the corresponding operating range and waiting until the interior surfaces have completed outgasing the residual atmospheric gases can take from several hours to several days. Such costs and delays reduce the efficiency and, hence, the commercial value of large-scale PVD manufacturing. Although CVD can operate at low vacuum ($\sim 25$ to 760 torr), CVD requires transport of the precursors of the material desired to be deposited via chemically reactive carrier gases. The chemical reactions or decompositions that result in the desired deposition also frequently create exhaust products that are toxic or corrosive, which then require additional procedures (typically involving scrubbers) to prevent their release into the atmosphere. Further, CVD requires cleaning of the deposition chamber on a frequent and regular basis to maintain high quality of the thin films subsequently fabricated in the same chamber. As in PVD techniques, such encumbrances erode the efficiency of large-scale manufacturing by CVD. Misted deposition devices and processes in the prior art operate at low vacuum and do not require the maintenance of CVD devices, but are not suited to large-scale manufacturing since only one wafer can be fabricated at a time. Thus, an apparatus and method for producing thin films for use in active components in integrated circuits that is capable of sustained continuous or semi-continuous production that is easy and relatively cheap to maintain, produces a finished and consistently high quality thin film, permits a shorter production time, and results in high yields of integrated circuit chips would be highly desirable.

SUMMARY OF THE INVENTION

An object of the invention is to provide a relatively low energy process and apparatus for manufacturing high quality thin films of use in active components in integrated circuits in commercial quantities.

Another object of the invention is to provide such a process and apparatus that employs a low or no vacuum environment.

Another object of the invention is to provide one or more of the above objects in a process and apparatus that does not require the use of reactive chemistry and does not create toxic or corrosive by-products.

Another object of the invention is to provide one or more of the above objects in a process and apparatus that does not require frequent cleaning of the deposition chamber.

A further object of the invention is to provide one or more of the above objects in a process and apparatus that permits automatic processing of multiple wafers.

Still a further object of the invention is to provide one or more of the above objects in a relatively fast process capable of mass production of high quality thin films in a relatively short time.

The invention provides an assembly line type of manufacturing process for the fabrication of solid thin films on integrated circuit substrates from liquid precursors.

The invention provides a movable platen that includes a plurality of integrated circuit substrate stations. The invention also provides a plurality of fabrication devices arranged in a predetermined sequence and spaced at a distance corresponding to the distance between the substrate stations on the platen. The substrate stations progress from the operational vicinity of one fabrication device to the next, and while one manufacturing process step is being performed on one substrate, other manufacturing process steps are being performed on other substrates at other stations. Each substrate station progresses along a series of fabrication devices until a solid thin film is completed on the substrate. In this manner, three or more integrated circuit substrates may be simultaneously processed to form a high electronic quality thin film on each substrate.

In the preferred embodiment, the predetermined sequence of fabrication devices include a liquid deposition device, a device for drying the deposited liquid film, and a device for solidifying the dried film to form a solid thin film. Preferably, the method steps include depositing a liquid film, drying the film, and annealing the dried film.

Preferably, the deposition device comprises a misted deposition device. Preferably, the misted deposition device includes a mist showerhead and a vacuum chamber for enclosing the substrate. Preferably, the misted deposition device includes an electrical particle acceleration system. Alternatively, the deposition device can comprise a spin coating device.

Preferably, during the deposition process, the substrate is at ambient temperature. Preferably, the ambient temperature is between about 15° C. and 40° C. In general, the temperature may be between about −50° C. and 100° C.

Preferably, the misted deposition is performed in a low vacuum, generally between approximately 5 Torr and 800 Torr. More preferably, the vacuum is maintained between about 450 Torr and 700 Torr.

Preferably, the drying device comprises a heater, though it may also comprise the above-mentioned vacuum chamber.

Preferably, each substrate is dried by heating it to between 100° C. and 300° C.

After the substrate is dried, it is optionally baked at a temperature of between 250° C. and 450° C.

Preferably, the solidification device comprises a rapid thermal processing (RTP) device. Alternatively, the solidification device may comprise a furnace.

Preferably, the rapid thermal processing step is performed at a temperature between 300° C. and 850° C., with a ramping rate between 1° C./sec and 175° C./sec, and most preferably 75° C. per second, and with a holding time of five seconds to 300 seconds. The annealing step, if performed in a furnace, is performed at a temperature between 500° C. and 850° C. for a period of between 15 minutes and three hours.

In one embodiment, a pretreatment device is inserted in the predetermined sequence before the deposition device to properly prepare the substrate for the deposition of a liquid precursor film.

In another embodiment, a cooling device is inserted into the predetermined sequence after the heating device to prepare the thin film for further processing or for unloading.

Preferably, the apparatus also includes a loading/unloading device.

In a further embodiment, there is plurality of predetermined sequences of fabrication devices, which permits a plurality of thin film layers to be simultaneously fabricated. Multiple layered thin films can be fabricated by repeating the predetermined sequence as many times as appropriate for the desired properties of the final thin film.

Preferably, the fabrication devices are arranged in a substantially circular sequential arrangement and the movable platen is also substantially circular. In this embodiment, the stations of the platen are angularly distributed around the axis of rotation of the platen so that each substrate-loaded station proceeds from one device to the next device in the sequence by rotation of the platen through a predetermined angle.

In yet another embodiment, there are a plurality of concentric rings of stations on the platen, and a plurality of concentric rings of fabrication devices, each fabrication device ring having the sequence or sequences of fabrication devices angularly distributed over it.

In another embodiment, the movable platen is substantially linear and the fabrication devices are arranged in a substantially linear predetermined sequence.

A modification of the above embodiment involves a plurality of parallel series of stations and a plurality of parallel predetermined linear sequences of fabrication devices.

Each station on the platen preferably comprises a rotatable substrate holder that can be rotated independently of the rotation of the platen.

Each station on the platen should preferably include at least one exhaust aperture. The exhaust apertures vent excess mist during the deposition of the liquid precursor as well as evaporates that may exist as a result of the pretreatment, drying, baking, rapid thermal processing, annealing or cooling stages.

The invention recognizes for the first time that the misted deposition process, in contrast to other processes used for deposition of thin films of active components in an integrated circuit, lends itself to an automated assembly line approach to thin film fabrication. Since high vacuums are not required, bulky, unwieldy deposition chambers that can only be operated as a single stage in a manufacturing process are not required.

The invention not only provides economical and fast production of commercial quantities of integrated circuits, but the apparatus of the invention can also be operated for extensive periods without maintenance. Other objects, advantages, and salient features of the present invention will become apparent from the following detailed description which, when taken into conjunction with the annexed drawings, discloses a number of embodiments of the invention.

DETAILED DESCRIPTION OF THE PREFERRED EMBODIMENT

Figure 1:
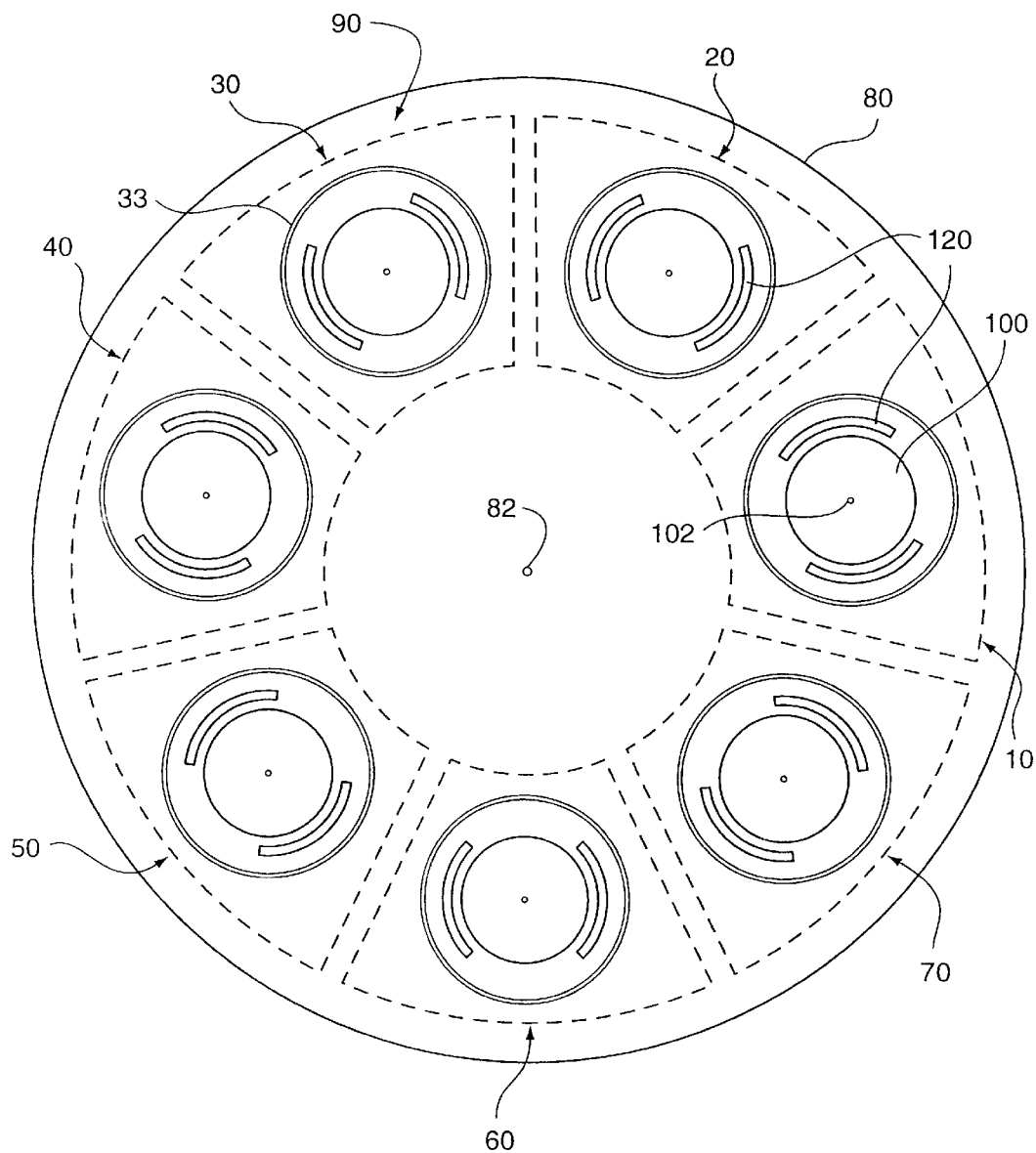
FIG. 1 is a top view of a circular platen of the apparatus which contains seven stations according to one embodiment of the invention.

According to a primary aspect of the present invention, finished thin films residing upon a substrate are fabricated using a relatively fast automated step progression involving the deposition of a liquid precursor layer upon the substrate using a misted deposition (MD) technique. The steps can also include drying and baking the liquid layer, applying a rapid thermal processing (RTP) technique (sometimes referred to in the art as rapid thermal annealing or RTA), and cooling the resulting processed layer, and then, optionally, repeating the whole procedure. Though not the preferred process, the steps can also include furnace annealing of the film. As is common in the art, in this disclosure, the term "substrate" is used in the general sense in which it means any one or a number of layers of material upon which a thin film layer may be deposited, in addition to a particular sense in which it means the silicon wafer 602 itself (FIG. 16). That is, "substrate" is any object upon which a material is deposited using the process and apparatus of misted deposition. For details of the apparatus and methods of misted deposition, see U.S. Pat. No. 5,456,945 issued Oct. 10, 1995 to Larry D. McMillan, et al., and U.S. Pat. No. 5,997,642 issued Dec. 7, 1999, which patent and application are incorporated by reference as though fully disclosed herein. The following is a brief overview of misted deposition, a summary of the above references.

Misted deposition is a process which can be used for easily and economically producing thin films from a few angstroms to microns in thickness of complex materials, such as layered superlattice compounds, of suitable high quality for use in integrated circuit memories. We refer to any material that can be described by a single chemical formula and which spontaneously forms itself into alternating layers having distinctly different crystalline structures as layered superlattice materials. The term "layered superlattice compound" is selected to distinguish these superlattice materials from alloy type superlattice materials, which are not layered, and superlattice heterostructures, which are inherently not a chemical compound but rather layered structures made of at least two different materials having different chemical formulae.

Precursor liquids used by misted deposition include sol-gel precursor formulations, which in general are comprised of metal-alkoxides in an alcohol solvent; metallorganic precursor formulations, sometimes referred to as MOD formulations, which in general comprise a metal-carboxylate formed by reacting a carboxylic acid, such as n-decanoic acid or 2-ethylhexanoic acid, with a metal or metal compound in a solvent; and combinations of sol-gel and MOD formulations, as well as other precursor formulations. The term "mist" as used herein is defined as fine drops of liquid carried by a gas, which can include an aerosol, a vapor, and a fog, as well as other nebulized suspensions of the precursor solution in a gas. The term "deposition device" as used herein is defined as an apparatus utilizing the MD technique.

A typical duration for misted deposition of the liquid precursor upon a substrate is two to ten minutes, during which the substrate may be rotated on the order of 15 rounds per minute (rpm). The size of the mist droplets and rate of deposition, among other aspects, are beyond the scope of the present invention. For further details, refer to the above-referenced patent and application. The misted deposition device of the present invention differs in some essential aspects from the misted deposition devices of the prior art, and, therefore, will be described in detail herein.

The pretreatment stage, sometimes referred to as a prebake, of the present invention is intended to outgas the substrate of unwanted atmospheric gases and moisture condensate. The prebake preferably comprises flash ultraviolet (UV) heating or baking on a hotplate for about two to fifteen minutes. It may also comprise heating in a furnace.

After deposition, the material deposited on the substrate, which is liquid, is dried, preferably by exposure to vacuum for a two to ten minute period, or by heating with a radiant heater, heating with a resistance heater, or by some other suitable method for a period of from one to 15 minutes. A baking step or series of baking steps may follow, each of between one minute to 15 minutes.

After the drying/baking step, the material is solidified. After drying and prior to solidification, the material of the deposited thin film essentially comprises the elements of the final desired chemical compound, though they may not be in the final desired crystal structure. The solidifying step preferably comprises RTP. The RTP assists in breaking up whatever bonds of the precursor chemical compounds that remain, drives off any remaining organics from the precursor compounds, and causes the desired elements to form the desired crystal structure. The RTP can be performed at temperature of from 500° C. to 900° C. for from 15 seconds to five minutes. Preferably, the RTP is at about 725° C. for about 30 seconds in oxygen. The solidifying step may also include a furnace anneal that forms the final crystal structure. However, the final crystal structure is usually formed in a high temperature furnace anneal process, which is done at from 650° C. to 850° C. for from 30 minutes to two hours, preferably at about 800° C. in oxygen for one hour. Because the length of time this process takes, it is preferably not done on the movable platen, but rather is done separately after the wafer is unloaded from the platen.

The preheating, drying, heating, baking, RTP, and furnace anneal apparatus and methods of the present invention differ only a little from the apparatus and methods described in the above-referenced patent and application, and will, therefore, be discussed herein only insofar as they differ from the patent and application.

The preferred embodiment of the invention also includes a cooling device to prepare the substrate for possible further processing or to facilitate its unloading from the platen. The cooling device is not described in detail in the foregoing patent and application, and, therefore, is discussed in detail below.

Figure 11:
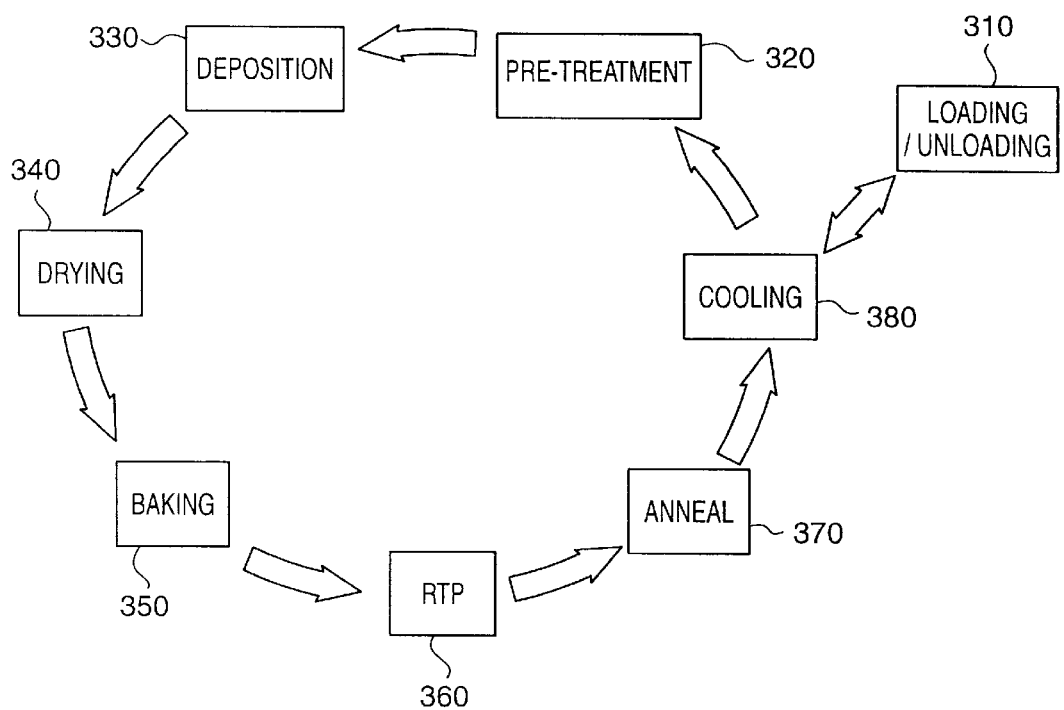
FIG. 11 is a flow chart showing the preferred process for fabricating a single thin film located on a single station of the seven station device of FIG. 1.

The top view of a preferred embodiment of the circular movable platen 80 of the present invention is shown in FIG. 1. This embodiment includes seven angularly distributed stations 10, 20, 30, 40, 50, 60, and 70. Each substrate station 10, 20, etc., includes a substrate holder 100 which is independently rotatable about its own station axis 102, which independent rotation is primarily used during the misted deposition stage. Each station, such as 10, on the platen 80 includes at least one exhaust aperture 120. In the preferred embodiment, each station has two exhaust apertures 120, each formed in a circular arc adjacent the substrate holder. The purpose of the exhaust apertures are to remove excess mist during the deposition step, any evaporates that may exist during the other steps, and to prevent cross-contamination between the devices. The exhaust apertures are positioned close to the substrate to effectively remove mist and evaporates, and so they are enclosed in housings 405, 505 (FIGS. 4 and 5) that enclose the substrate in some processes. Each station also includes a groove 33 about the circumference of the station. The purpose of the groove 33 is to receive a lip 630 of housings 405, 705 to assist in sealing the enclosure during the deposition and other processes. The seven devices that cooperate with the platen of FIG. 1 are indicated in the flow diagram of FIG. 11 and include: a pretreatment device that performs step 320; a deposition device that performs step 330; a drying device that performs step 340; a baking device that performs step 350; an RTP device that performs step 360; an anneal device that performs step 370; and a cooling device that performs step 380. If any of the steps of the process take longer than about 15 minutes, it is done at two stations. For example, if for a particular process it is necessary to bake for a period of 20 minutes, then the apparatus is designed with two baking stations, and the baking step is divided into two ten-minute steps rather than one 20-minute step. A loading and unloading device that performs step 310 is also shown in FIG. 11, but does not mechanically cooperate with the platen except that it includes a robot arm that has access to the station located at the cooling device. In some embodiments the loading/unloading device has access to the pretreatment device 320. In other embodiments, the loading/unloading device may be located above the platen and may mechanically cooperate with the platen.

Figure 2:
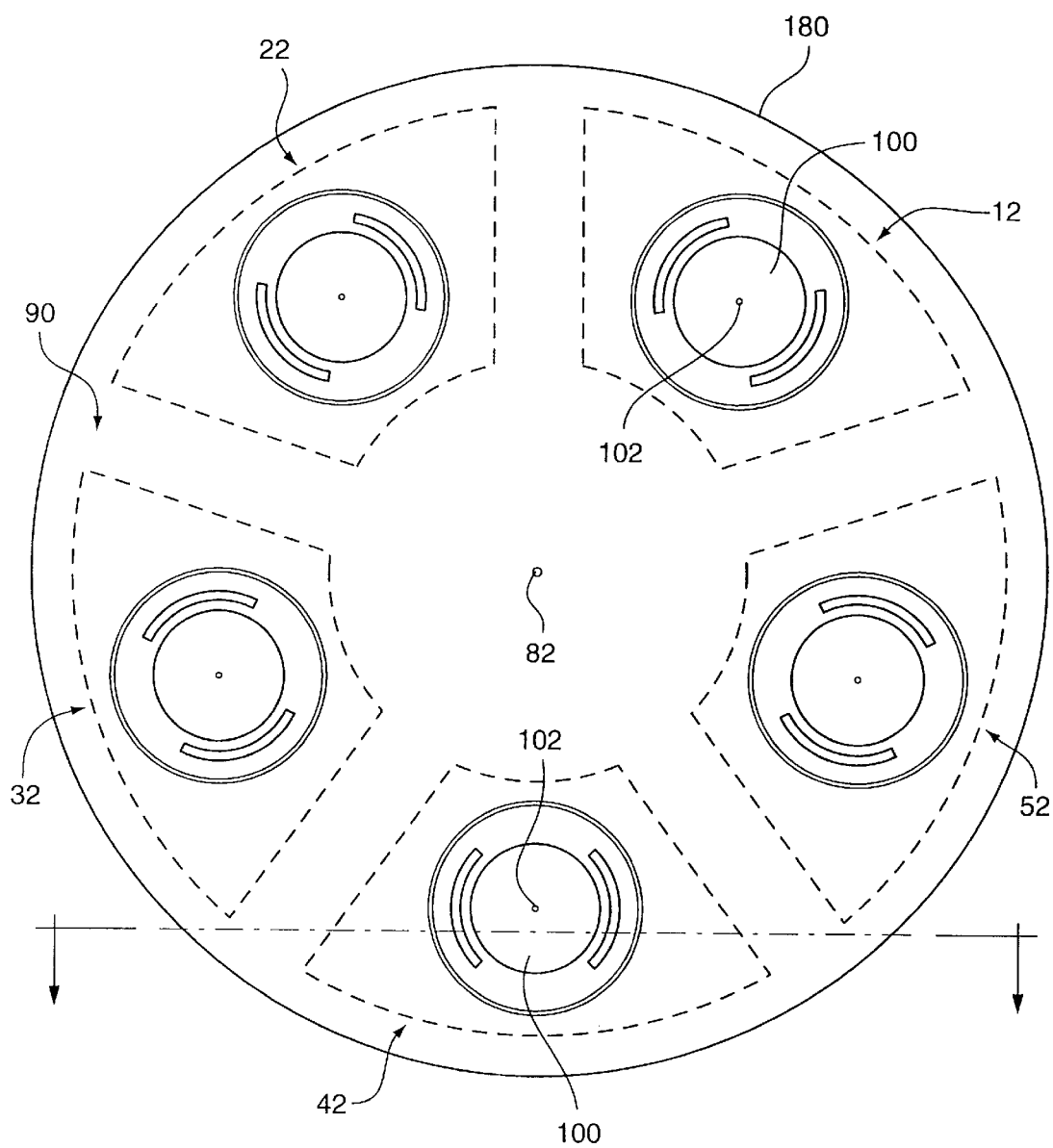
FIG. 2 is a top view of a circular platen of the apparatus which contains five stations according to the preferred embodiment of the invention.
Figure 3:
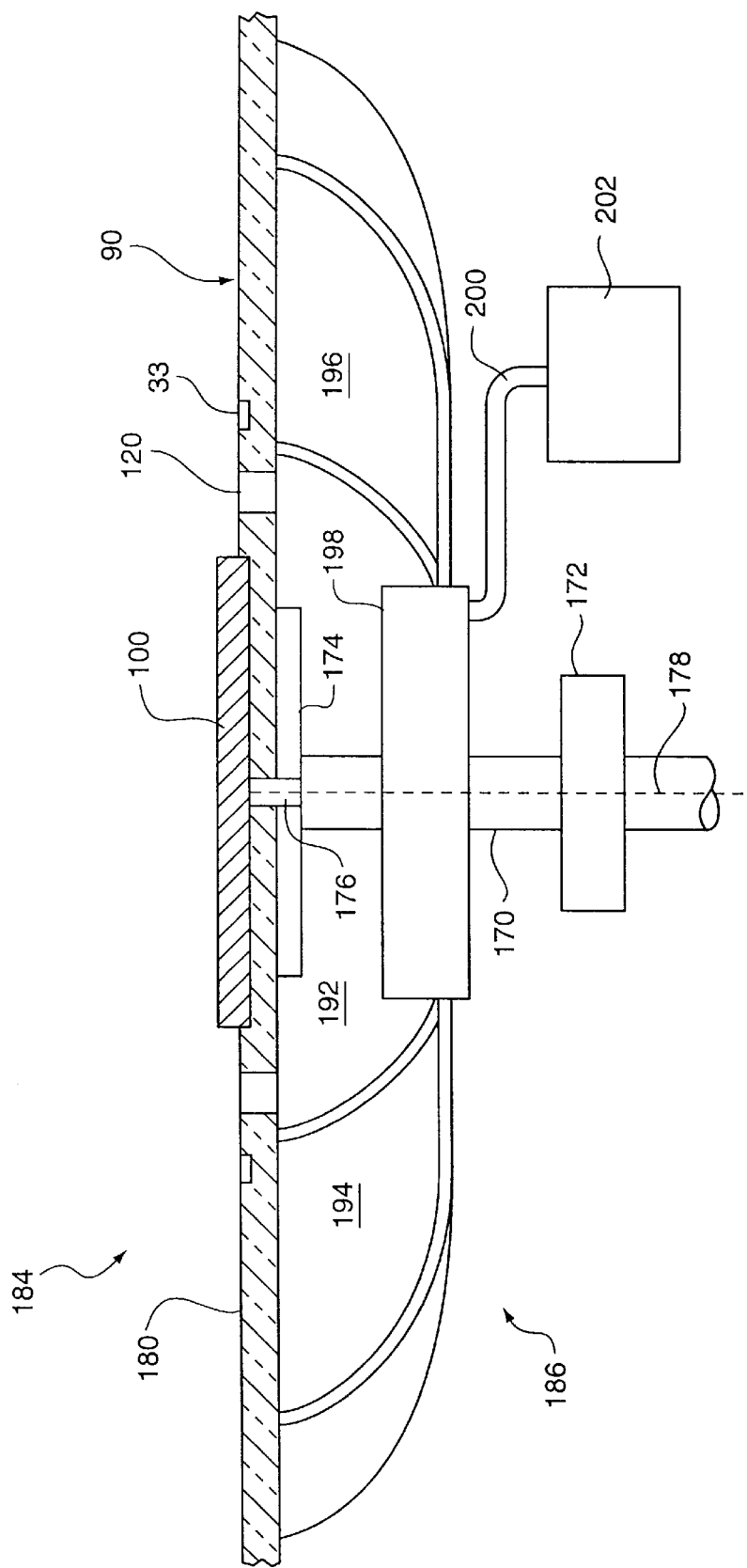
FIG. 3 is a cut-away side view of a representative station on the platen of FIG. 2 taken through the line 3—3 in FIG. 2.

The preferred embodiment of a platen 180 according to the invention is shown in FIGS. 2 and 3. This platen 180 is identical to the platen of FIG. 1 except that it has only five stations—12, 22, 32, 42, and 52. The parts of the platen that are the same are indicated with the same numerals as the corresponding parts in FIG. 1 for clarity. FIG. 3 shows a plane view of the platen assembly 184 taken through the line 3—3 in FIG. 2. The platen assembly 184 includes platen 180, vacuum manifold assembly 186, rotatable platen support 170, platen drive 172, substrate holder 100, substrate drive 174, a rotatable substrate drive connector shaft 176, and electrical power conduit 178 which passes down the center of platen support 170. Power conduit 178 includes power cables to both the substrate drive 174 and the substrate holder 100. Platen support 170 rotatably supports platen 180 along axis 82 (FIG. 2). Substrate holder 100 is preferably made of a conductive material so that the substrate may act as the lower electrode of an electrical mist particle acceleration system. See U.S. Pat. No. 5,997,642 for details of the electrical mist particle acceleration system. Shaft 176 supports substrate holder 100 along axis 102 (FIG. 2), and is preferably made of an insulator material. Substrate drive 174 is preferably a magnetic drive that acts through platen 180. Platen drive 172 is preferably an electric motor drive. Vacuum assembly 186 includes five separate chambers, one for each station, three of which are shown in FIG. 3: chamber 192 is associated with station 42; chamber 194 is associated with station 32; and chamber 196 is associated with station 52. Each chamber communicates with its associated station through the corresponding apertures 120. Vacuum manifold 198 controls the vacuum applied to each station. A variety of vacuum pumps in vacuum pump assembly 202 maintains a selected vacuum in manifold 198.

Each of the platens 80, 180, etc., herein is movable in such a manner as to sequentially advance its stations to the operational vicinity 110 (FIGS. 4 and 5) of a number of operational devices 600, 700 which preferably is equal to the number of stations. The term "operational vicinity" is defined as that area and/or volume in which the operational device in question is able to operate on the substrate that currently resides in that area/volume. The shape and dimensions of the operational vicinity may vary from one device to another, but for visual consistency are represented in the various drawings as substantially similar. The stations and devices are arranged so that each one of the stations simultaneously comes into the operational vicinity of one of the devices. Associated with each platen is a predetermined sequence of operational devices: preferably seven operational devices in the case of the platen of FIG. 1 and preferably five operational devices in the case of the platen of FIG. 2. The circular platens 80 and 180 are rotated around their platen axis 82 through a predetermined angle to advance each station to the next device. The term "station" herein is defined as a location on the platen surface 90 designed to hold a substrate and associated elements for the purposes of being operated upon by the various devices. The term "angularly distributed" is defined as a distribution of items arranged around a central point such that the angle subtended by adjacent items in this arrangement is essentially the same between all pairs of neighboring items. Similarly, "predetermined angle" is defined as the angle that is subtended by adjacent items that are angularly distributed. For example, an initial configuration of platen 80 could have station 10 in the operational vicinity of a loading/unloading device, station 20 in the operational vicinity of a pretreatment device, station 30 in the operational vicinity of a deposition device, station 40 in the operational vicinity of a drying device, station 50 in the operational vicinity of a baking device, station 60 in the operational vicinity of an RTP device, and station 70 in the operational vicinity of a cooling device. When each device has completed its operation upon the substrate that is loaded upon a substrate holder 100 at the station, the platen 80 is rotated to the next operational vicinity 110 in the predetermined sequence.

Figure 4:
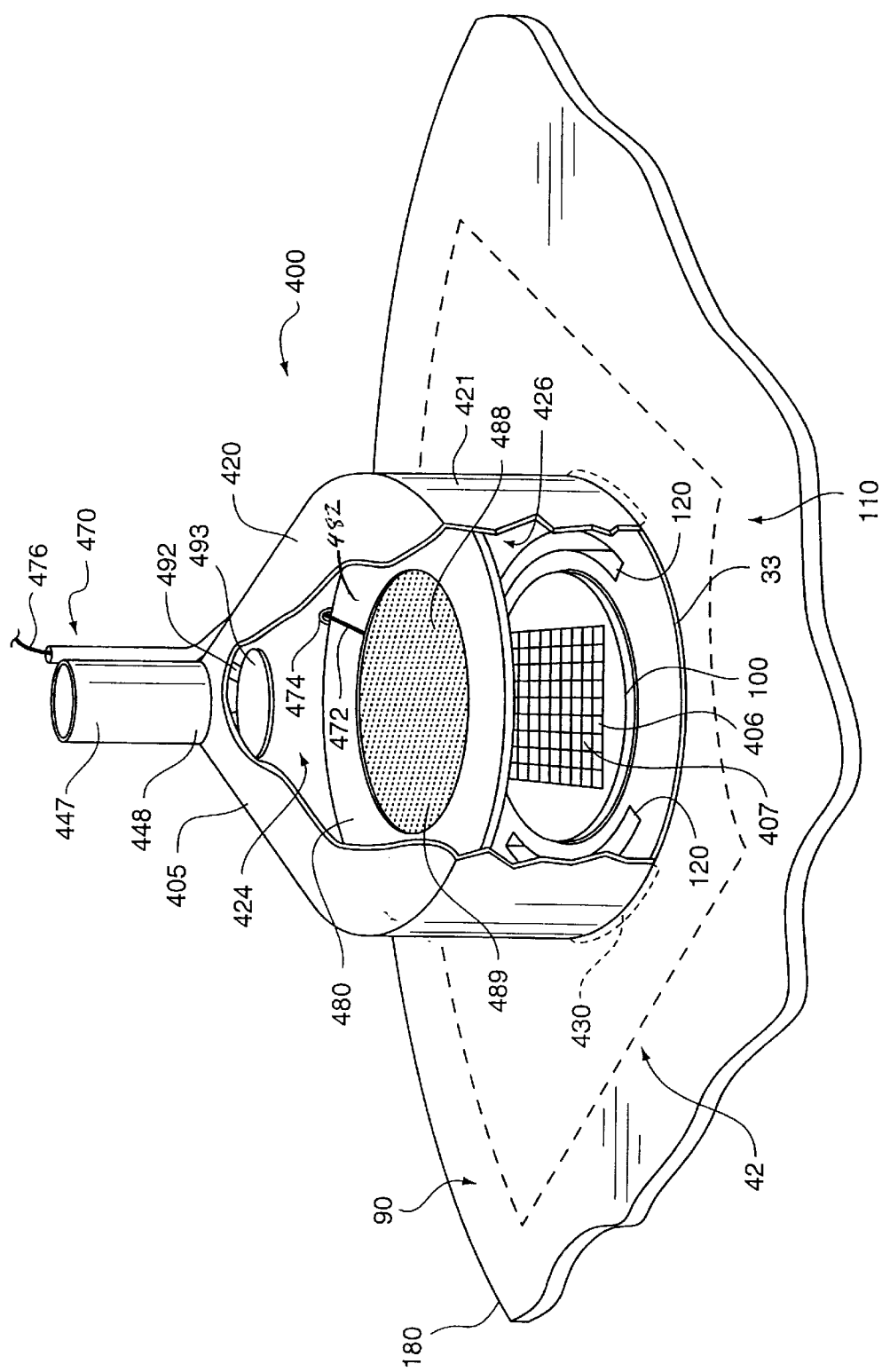
FIG. 4 is a partially cut-away perspective view of a misted deposition fabrication device according to the invention for use with the platens of FIGS. 1 or 2.
Figure 5:
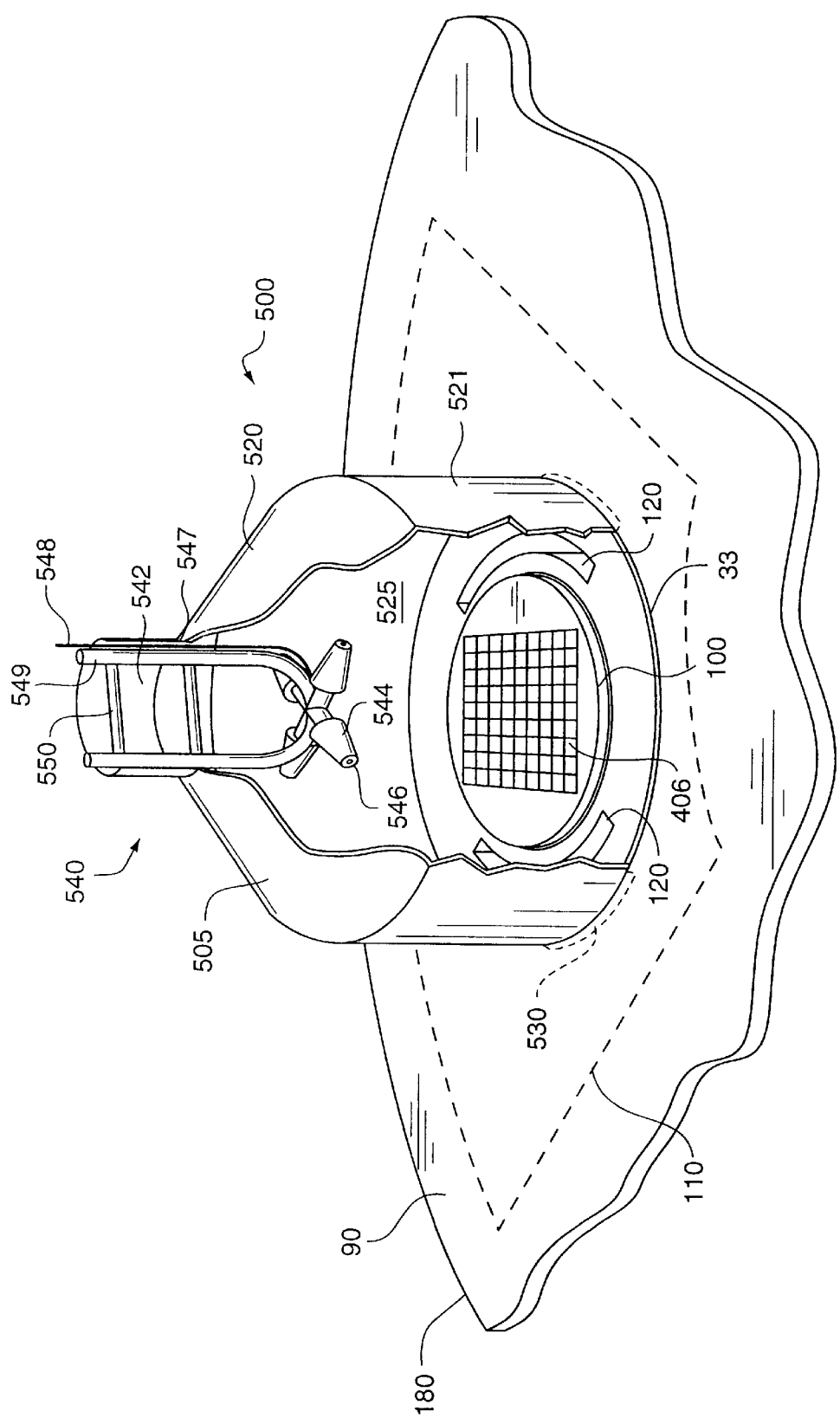
FIG. 5 is a partially cut-away side view of a cooling device according to the invention for use with the platens of FIGS. 1 or 2.

Examples of operational devices are shown in FIGS. 4 and 5. FIG. 4 shows a partially cut-away misted deposition device 400 according to the invention. Misted deposition device 400 includes a housing 405, a mist conduit 447, an electrical conduit 470, a baffle 493, and a mist inlet plate 480. Housing 405 includes a conical upper portion 420, having an opening 448, a cylindrical lower portion 421, and a flexible lip 430, which is shown by a dotted line since it is within groove 33. Mist conduit 447 is attached to the narrow end of conical portion 420 at opening 448. Electrical conduit 470 includes an external electrical cable 476 and an internal electrical cable 472 connected via a feed-through 474. Baffle 493 is attached to the conical portion 420 by baffle support 492. Mist inlet plate 480 includes a washer-shaped outer portion 482 which is preferably made of an insulating material, such as a plastic, and a circular showerhead inner portion 489, which is preferably made of a conductive material, such as aluminum. Showerhead portion 489 includes a multitude of small openings 488 as described in U.S. Pat. No. 5,997,642. Mist inlet plate 480 separates housing 405 into a velocity reduction chamber 424 and a deposition chamber 426. A substrate wafer 406 is shown on substrate holder 100. As known in the art, wafer 406 is divisible into many individual integrated circuit chips, such as 407. Lip 430 of housing 405 fits into groove 33 in platen 180 to form a vacuum seal. Baffle 493 prevents mist particles from streaming through the holes 488 in showerhead and causing uneven deposition on wafer 406. Electrical conduit 470 provides electrical power to mist showerhead 489 which also is an electrode of the electrical particle acceleration system. Showerhead 489 is approximately the same diameter as wafer 406. The distance between showerhead 489 and wafer 406 is exaggerated in the drawing to make it possible to show the essential details. Please refer to U.S. Pat. No. 5,997,642 for the preferred distances and other details.

FIG. 5 shows a partially cut-away view of a cooling device 500 according to the invention. Cooling device 500 includes a housing 505 and a compressed gas assembly 540. Housing 505 includes a neck portion 542, a conical upper portion 520 and a cylindrical lower portion 521, forming a cooling chamber 525, and a flexible lip 530. Compressed gas assembly 540 is attached to the neck portion 542 at opening 547 by brazing or welding. Compressed gas assembly 540 includes a pair of thick steel tubes 549, support framework 550, a control and power cable 548, four valves 544, and four gas expansion outlets, such as 546. Tubes 549 carry an inert gas under high pressure from a pressurized gas source (not shown). Valves 544 are controlled via cable 548. The gas outlets 546 release in a direction parallel to the plane of the substrate 406, so the released gas does not stream directly toward the substrate surface. Substrate wafer 506 is shown on substrate holder 100. Lip 530 of housing 505 fits into groove 33 in platen 180 to form a vacuum seal. The expansion outlets 546 permit the gas to expand, and, therefore, cool the cooling chamber 525 without disturbing the film on substrate 406.

Figure 6:
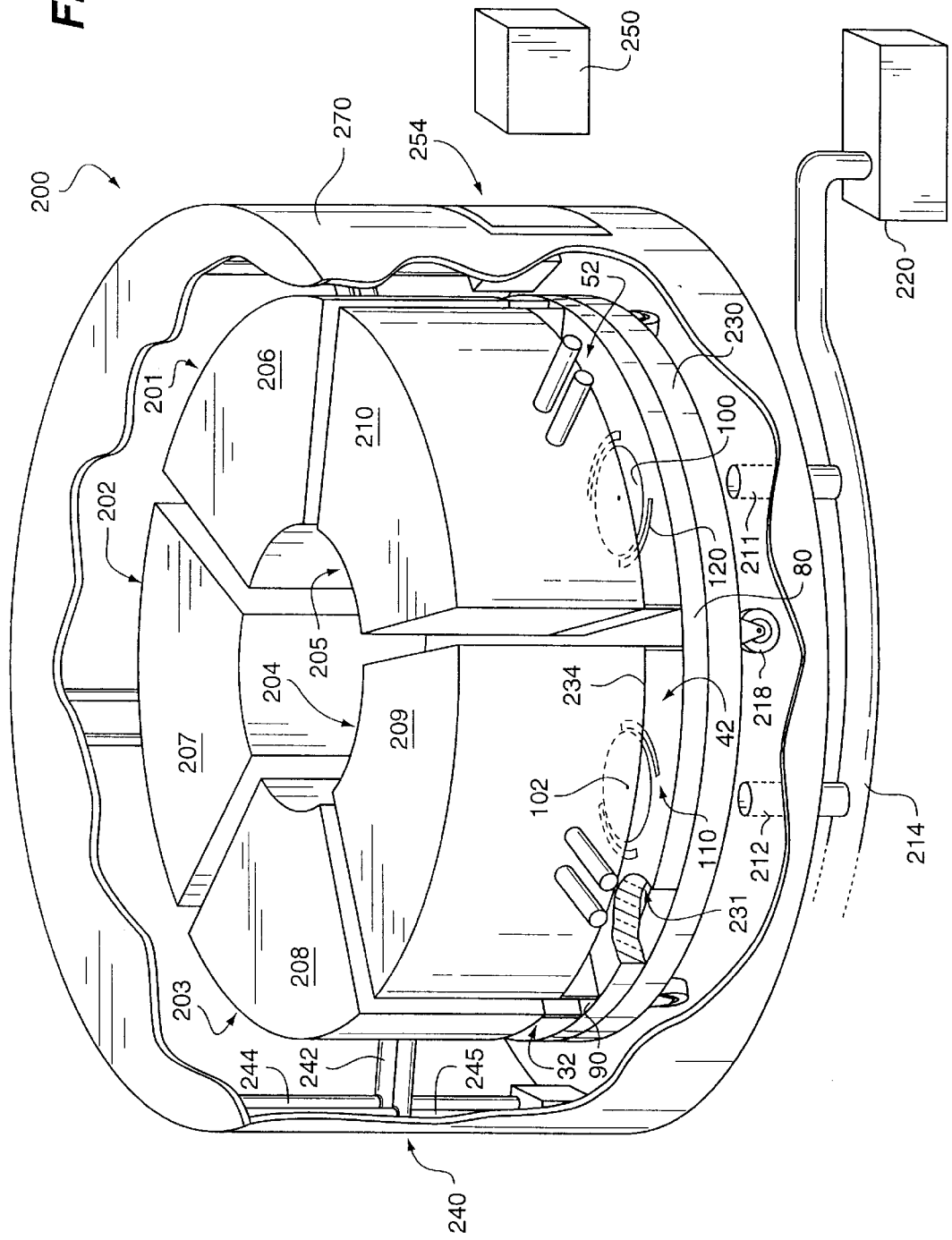
FIG. 6 is a perspective view showing an alternative preferred embodiment of the apparatus according to the invention.

A partially cut-away view of an alternative preferred embodiment of a thin film fabrication apparatus according to the invention is shown in FIG. 6. This embodiment utilizes the five station platen 180 of FIG. 2, and, therefore, the numerals referring to the platen 180 and its elements are the same as in that figure. The most significant difference between this embodiment and the previous embodiment is that the entire platen 180 and operational devices 201, 202, 203, 204, and 205 are enclosed in a vacuum chamber 270. Devices 201,202,203,204, and 205 are shown above their corresponding stations 12, 22, 32, 42, and 52, respectively. In this embodiment, the device housings 206-210 are preferably wedge-shaped.

There are two preferred methods of gaining access to the substrate holders 100 under housings 206–210. In one method, there is a slot 234 in each of housings 206–210 and the substrates are loaded and unloaded through the slot 234. In another embodiment, the housings 206–210 are moved by means of arms, such as 242, which are driven up and down on a pair of cylindrical tracks 244 and 245 by compressed inert gas. The former embodiment is preferred when all the devices 201–205 are operated at substantially the same pressure. The latter embodiment is preferred when the devices 201–205 are operated at different pressures. Both embodiments are illustrated in FIG. 6. Only one housing movement mechanism 240 is shown, and the conduits for flowing gas, mist, etc., to the enclosures are not shown, so as not to unduly clutter the drawing. In this embodiment, platen 180 rests on a washer-shaped frame 230 which rolls on wheels 218. In the preferred embodiment, the exhaust ports 211,212, etc., connected to a vacuum pump 220 via vacuum line 214, are located below the positions where the platen stations, such as 42 and 52, stop to prevent intermingling of the gases and evaporates from the various operations and contamination through back flow. The interior portion 231 of frame 230 is hollow to allow the exhaust to flow freely from the apertures 120 to the exhaust ports 211, 212, etc. The operational devices preferably include a pretreatment device 201, a deposition device 202, a drying/baking device 203, an RTP device 204, and a cooling device 205. The pretreatment device 201 and the drying/baking device 203 are preferably radiant and/or resistance heaters, but also may be other heating devices. The deposition device 202 is preferably a misted deposition device as shown in FIG. 4. However, now that the multiple station misted deposition system has been disclosed, a similar system can be adapted for spin coating or other conventional liquid deposition processes. The spin coating devices, however, do not provide as fine a step coverage as the misted deposition system, and do not result in electronic devices with the same high quality of the devices produced by the misted deposition system. The RTP device 204 is a conventional RTP device using halogen lamps, though an anneal furnace may also be used. The cooling device 205 is preferably a gas expansion device as shown in FIG. 5, but also may be a conventional refrigeration device using a compressor and coils. A loading/unloading device 250 operates through a port 254 in vacuum chamber 270. The misted deposition device 202 and the cooling device 205 have been shown in detail herein. The other devices are well-known in the art, and those skilled in the art can adapt them to the fabrication apparatus shown herein.

Figure 7:
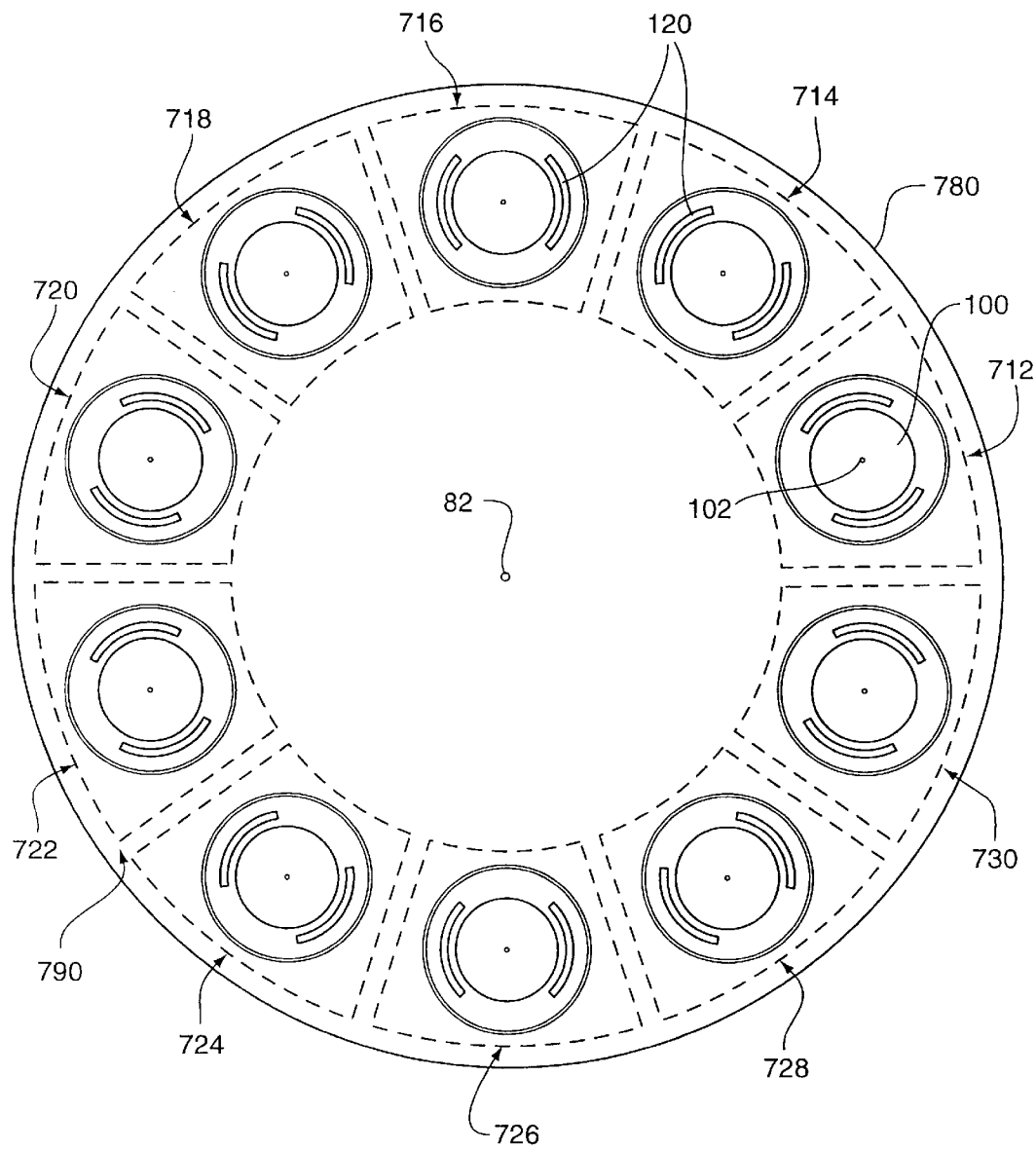
FIG. 7 is a top view of a circular platen of the apparatus which contains ten stations according to an alternate embodiment of the invention.

A top view of an alternate preferred embodiment of a platen in the invention is in FIG. 7. Platen 780 contains ten stations: 712, 714, 716, 718, 720, 722, 724, 726, 728, and 730. The platen is designed to cooperate with ten operational devices, where there are two operational devices of each type arranged in a circular periodic predetermined sequence; for example, two pretreatment devices 712 and 722, two deposition devices 714 and 724, two drying/baking devices 716 and 726, two RTP devices 718 and 728, and two cooling devices 720 and 730. "Periodic sequence" means that the one or more subsequences are repeated. For example, in FIG. 7, a first subsequence comprises pretreatment device 712, deposition device 714, drying/baking device 716, RTP device 718 and cooling device 720. This sequence of devices is repeated by devices 722–730. As in the prior embodiments, the platen 780 is rotated so that each station advances to the operational vicinity 110 of the next operational device in the periodic sequence. This platen can be used to simultaneously perform two fabrication processes on ten wafers, or to repeat a series of fabrication processes on five wafers.

Figure 8:
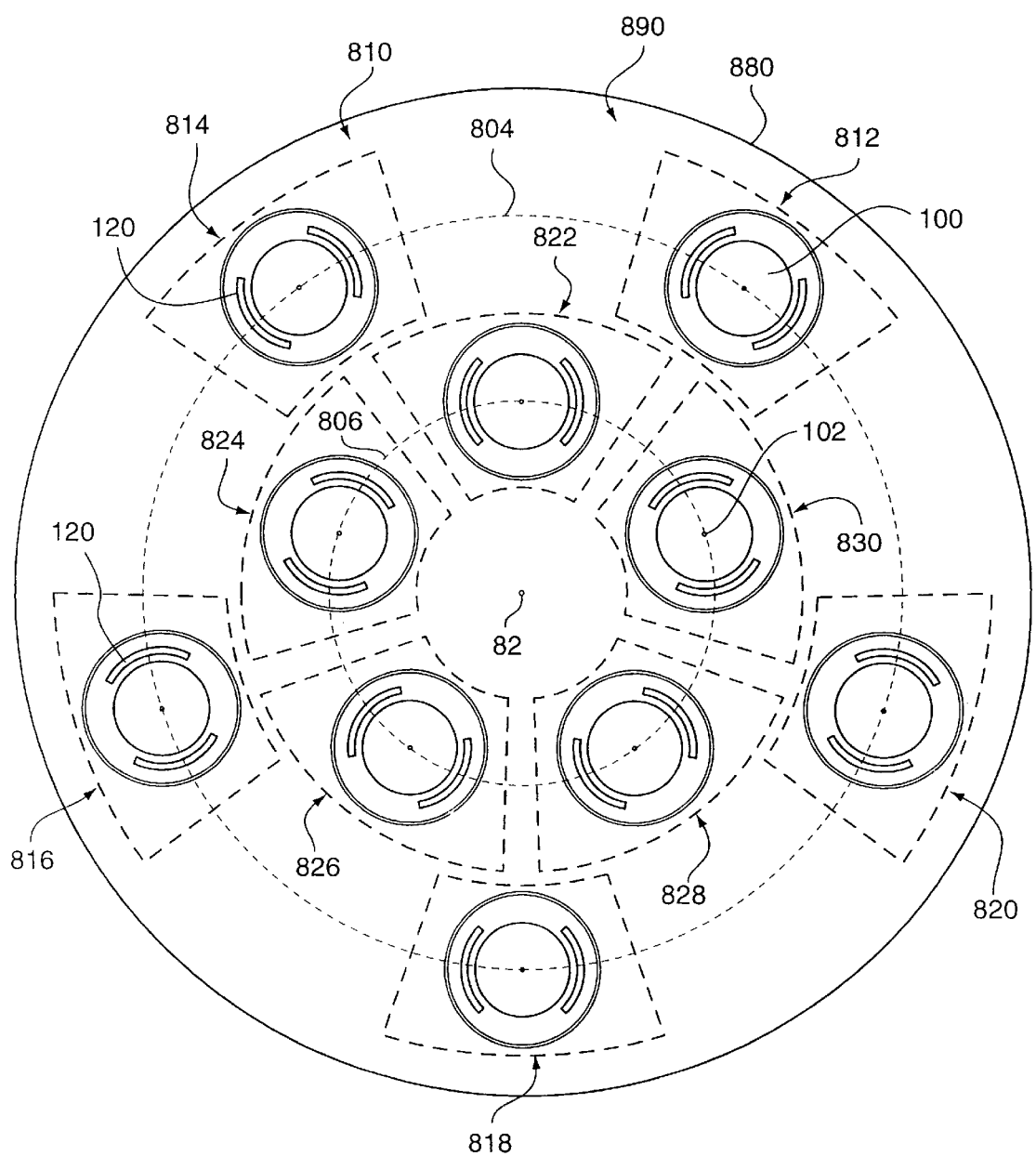
FIG. 8 is a top view of a circular platen of the apparatus which contains ten stations according to another alternate embodiment of the invention;.

FIG. 8 shows a top view of yet another alternate embodiment of a platen 880 according to the invention. It also contains ten stations: 812, 814, 816, 818, 820, 822, 824, 826, 828, and 830 on the platen surface 890. This embodiment also is designed to accommodate ten operational devices, and hence has, as in FIG. 7, two operational devices of each type. However, the ten devices are arranged in a modified circular periodic predetermined sequence. Stations 812, 814, 816, 818, and 820 are angularly distributed on first ring 804 of placement, and stations 822, 824, 826, 828, and 830 are similarly distributed on second ring 806. In contrast to FIG. 7, the two corresponding subsequences are parallel to each other instead of in series, the rings of placement 804, 806 being essentially concentric. As in FIGS. 1, 2, and 7, the platen 880 is rotated so that each station advances to the operational vicinity 810 of the next operational device in the periodic sequence.

Figure 9:
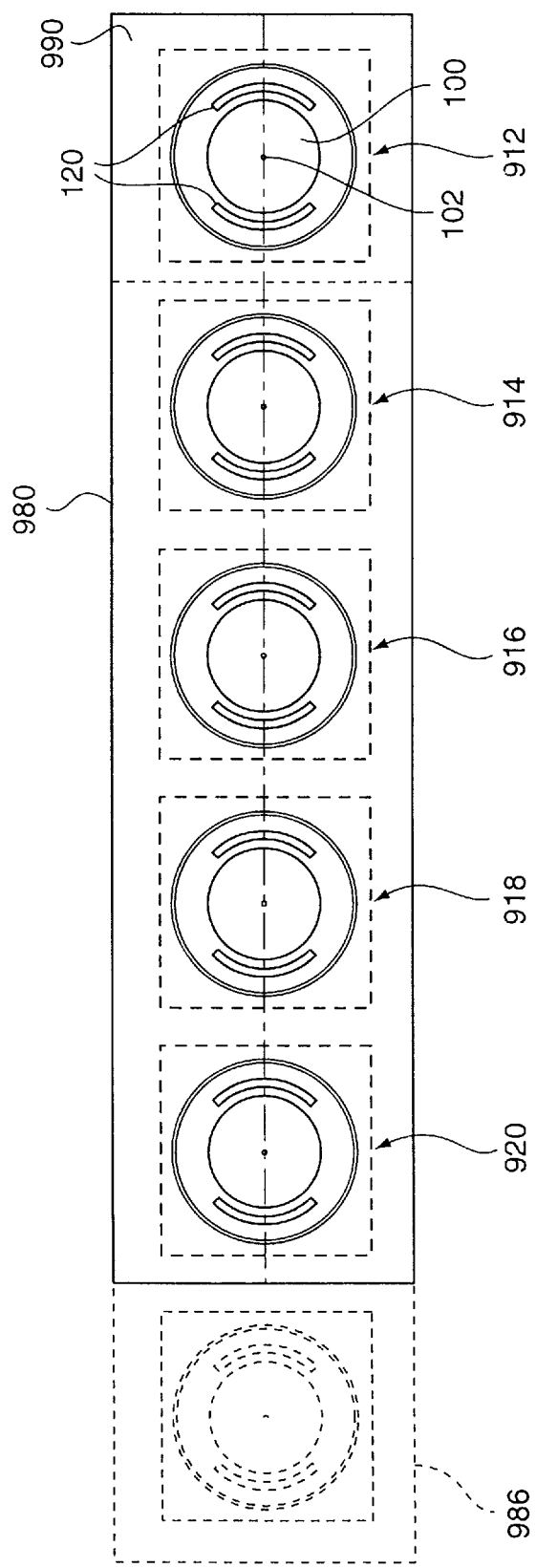
FIGS. 9 and 10 are top views of a platen of the apparatus according to alternative embodiments of the invention which contain five stations and ten stations respectively.

FIG. 9 is a top view of an alternate embodiment of a platen 980 according to the invention, comprising a linear platen 980 with five stations 912, 914, 916, 918, and 920 on the platen surface 990, designed to accommodate five operational devices. The only major distinction between platen 980 of FIG. 9 and platen 180 of the embodiment of FIG. 2 is that platen 980 is designed to move linearly so that the linearly distributed stations of FIG. 9 can advance a predetermined distance to the operational vicinity of the next operational device in the sequence. Similarly, the operational devices are arranged in a substantially linear predetermined sequence. The term "substantially linear predetermined sequence" is defined herein as a predetermined sequence in which the devices are arranged in an essentially straight-line pattern. The term "predetermined sequence" here has the same meaning as for FIG. 2. When platen 980 has advanced a predetermined distance, defined as the distance between two adjacent stations 912 and 914 of platen 980, the position of station 920 is represented in ghost at 986.

Figure 10:
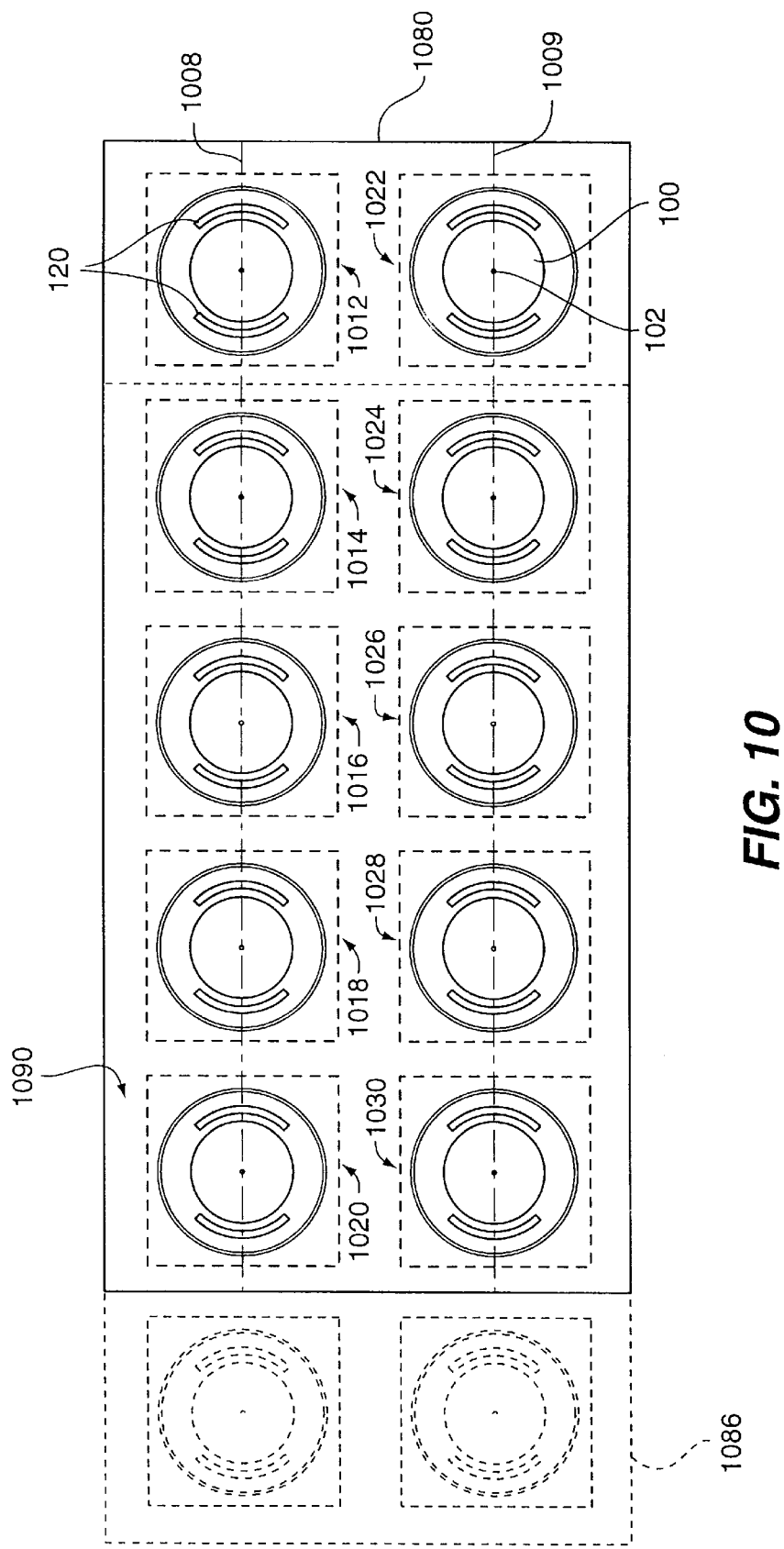

FIG. 10 is a top view of an alternate embodiment of the invention, involving a linear platen 1080 with ten stations 1012,1014,1016,1018, 1020, 1022, 1024, 1026,1028, and 1030 on the platen surface 1090, designed to accommodate ten operational devices. The ten stations are arranged in a modified linear periodic predetermined sequence. Stations 1012,1014,1016,1018, and 1020 are linearly distributed on first line of placement 1008, and stations 1022, 1024, 1026, 1028, and 1030 are similarly distributed on second line of placement 1009. The two major distinctions between platen 1080 of FIG. 10 and platen 880 of the embodiment of FIG. 8 is that platen 1080 is designed to move linearly so that the linearly distributed stations of FIG. 10 can advance a predetermined distance to the operational vicinity of the next operational device in the subsequence, and the two corresponding subsequences are essentially linearly parallel instead of concentric. When platen 1080 has advanced a predetermined distance, defined as the distance between two adjacent stations 1012 and 1014 of platen 1080, the position of stations 1020 and 1030 are as represented in ghost at 1086. Similarly, the operational devices are arranged in a modified linear predetermined sequence. The term "modified linear predetermined sequence" is defined herein as a sequence in which the devices are arranged in a predetermined order in a plurality of subsequences that are essentially parallel straight-line patterns. The term "predetermined sequence" here has the same meaning as for FIG. 2.

FIG. 11 is a flow chart describing the methods for which the platen embodiment corresponding to FIG. 1 can be utilized. The flow chart follows the progress of a single substrate-loaded station of the seven stations of FIG. 1. In one embodiment, after loading 310 and pretreating 320 the substrate, a film of liquid precursor is deposited by misted deposition 330, after which it is dried 340 and baked 350, then rapid thermal processed 360 and finally annealed 370, then cooled 380. Deposition step 330 preferably includes electrically accelerating the mist particles during the deposition process. After cooling 370 the resulting thin film, there are several optional steps from which to choose: each station may be unloaded and then reloaded in step 310; or each station may return to the cycle and repeat the entire or part of the process another time. In another embodiment, in the first cycle, the pretreatment step 320, the deposition step 330, the drying step 340, and the cooling step 380 are performed, and in the last cycle, the pretreatment step is skipped and the deposition step 330, the drying step 340, the baking step 350, the RTP step 360, the anneal step 370 and the cooling step 380 are performed, or the first cycle may be repeated many times followed by the last cycle. In another embodiment, the RTP step is included in each cycle. In the preferred embodiment, the anneal step 370 is not performed in the process of the invention, but is performed separately. However, it is shown in FIG. 11 for completeness, since for some materials the furnace anneal may be short enough to be included on the platen without making the overall process inefficient.

Figure 12:
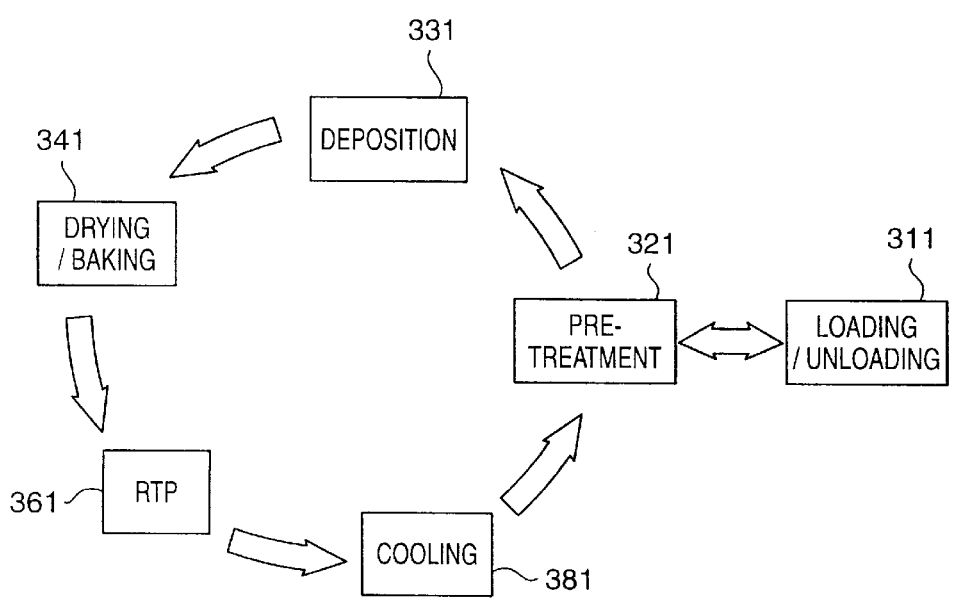
FIG. 12 is a flow chart showing the preferred process for fabricating a thin film located on a single station of the five station devices of FIGS. 2 and 9 and which may be used with the ten station devices of FIGS. 8 and 10.

FIG. 12 is a flow chart describing the methods for which the platen embodiments corresponding to FIGS. 2, 8, 9, and 10 can be utilized. The flow chart follows the progress of a single substrate-loaded station of the five stations of FIG. 2 through the steps of loading 311, pretreatment 321, deposition 331, drying/baking 341, RTP 361, cooling 381 and unloading/loading 311. Here, the steps 340 and 350 of FIG. 11 have been combined into one step 341, not necessarily to imply that they can be accomplished simultaneously, but rather to indicate that they still take place in the order of drying 340 and then baking 350 while residing in the operational vicinity of a drying/baking device that can sequentially dry first and bake next. Again, the deposition step 331 may include a process of electrically accelerating the mist particles. Again, the entire cycle or a portion of a cycle can be repeated as desired.

Figure 13:
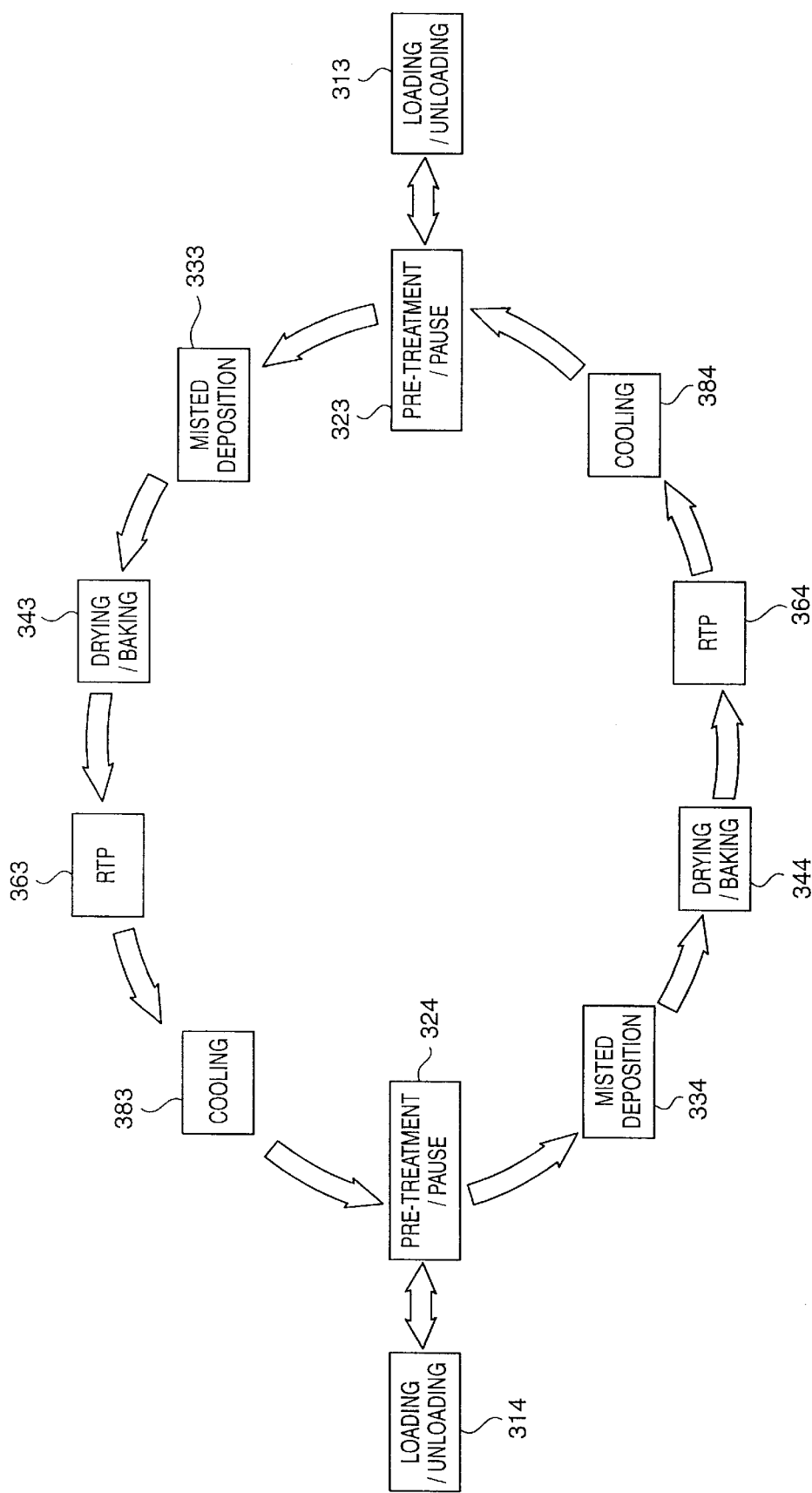
FIG. 13 is a flow chart illustrating two alternative preferred processes for fabricating a thin film located on a station of the ten station device of FIG. 8.

FIG. 13 is a flow chart describing the methods for which the platen embodiment corresponding to FIG. 7 can be utilized. The embodiment of FIG. 7 is essentially a doubling of stations and operational devices of the embodiment of FIG. 2. In one embodiment, the flow chart of FIG. 13 follows the progress of two individual substrate-loaded stations of the ten stations of FIG. 7. The two substrate-loaded stations are simultaneously loaded in steps 313 and 314, pretreated in steps 323 and 324, then a liquid precursor is deposited simultaneously upon them in steps 333 and 334, then they are simultaneously dried and baked in steps 343 and 344, simultaneously rapid thermal processed in steps 363 and 364, and finally simultaneously cooled in steps 383 and 384. According to this embodiment of FIG. 13, the two substrate-loaded stations have had one thin film layer deposited upon them, finished their processing and are ready to be unloaded. In another embodiment of FIG. 13, the loading/unloading step 314 is not done and a single substrate goes through all or a portion of the cycle 323, 333, 343, 363, 383 and all or a portion of the cycle 324, 334, 344, 364, and 384. The deposition steps 333 and 334 may include an electrical mist particle acceleration process.

Since the invention primarily relates to the recognition that the misted deposition process and other liquid deposition processes as applied to the integrated circuit art lends itself to an assembly line type process, and a disclosure of apparatus and methods for such a process, the details of the misted deposition fabrication process, to the extent that they are not critical to the invention, will not be repeated herein. These details are fully disclosed in U.S. Pat. No. 5,456,945 issued Oct. 10, 1995 and U.S. Pat. No. 5,997,642 issued Dec. 7, 1999, which are incorporated by reference as though fully disclosed herein.

Now that it is seen that the misted deposition process lends itself to an assembly line type process, it can also be appreciated that other liquid deposition processes, such as the spin-coating process, also can be used in the process and apparatus of the invention.

Figure 14:
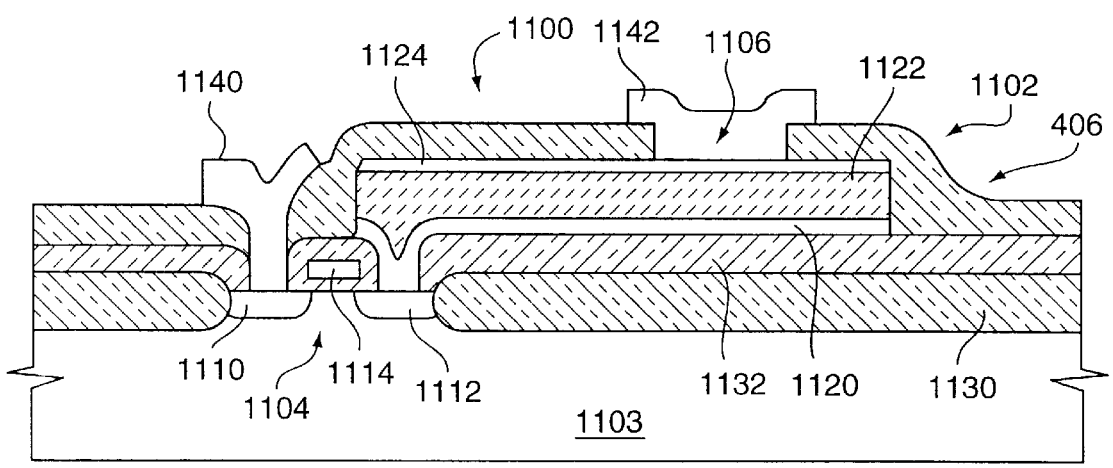
FIG. 14 is a cross-sectional view of an exemplary integrated circuit as may be made by the apparatus and methods of the present invention.

FIG. 14 shows an example of a portion of an integrated circuit 1100 as may be fabricated by the apparatus and methods of the invention. This particular circuit portion is a single memory cell 1102 of a 1T/1C (one transistor/one capacitor) DRAM that is a well-known integrated circuit in the art. Cell 1102 is fabricated on a silicon wafer 1103 and includes a transistor 1104 and a capacitor 1106. Transistor 1104 includes a source 1110, a drain 1112, and a gate 1114. Capacitor 1106 includes a bottom electrode 1120, a dielectric 1122, and a top electrode 1124. Field oxide regions 1130 formed on the wafer 1102 separate the various cells in the integrated circuit, and insulating layers, such as 1132, separate the individual electronic elements, such as transistor 1104 and capacitor 1106. The bottom electrode 1120 of capacitor 1106 is connected to the drain 1114 of transistor 1104. Wiring layers 1140 and 1142 connect the source of the transistor 1104 and the top electrode of capacitor 1106, respectively, to other portions of the integrated circuit 1100. The method of the invention has been used to deposit the dielectric material 1122, though it also may be used to deposit other elements of the circuit, such as insulator 1120.

In the case where the process is used to deposit the material 1122, the immediate substrate 406 on which the material 1122 is deposited is the bottom electrode 1120, but more generally may be thought of as the incomplete integrated circuit, including wafer 1103 and layers 1130,1132 and 1120 on which the material 1122 is deposited.

A feature of the invention is the selection of the process steps to be included on the platen to be ones that take approximately the same time. That is, the deposition takes about ten and no more than fifteen minutes, as does the pretreatment, the drying, the baking, and the cooling, while the RTP is usually shorter. Thus, there is little down time at any given station, making the entire process an efficient one.

A feature of the invention is that the misted deposition device includes a mist showerhead. This feature, in combination with the fact that the process is selected so that the times of each operation performed at each station are nearly the same, is important because it greatly simplifies the misted deposition device, permiting the deposition to be carried out in a movable housing.

Although there has been described what is at present considered to be the preferred embodiments of the invention, it will be understood that the invention can be embodied in other specific forms without departing from its spirit and essential characteristics. Moreover, the specific shapes, dimensions, and other parameters of the invention may be varied without departing from the teachings of the invention. The present embodiments are, therefore, to be considered as illustrative and not restrictive. The scope of the invention is indicated by the appended claims.

I claim:

1. An apparatus for fabricating a thin film, said apparatus comprising
    a. a predetermined sequence of devices, said predetermined sequence including: a misted deposition device including a mist showerhead, a velocity reduction chamber and a deposition chamber, said mist showerhead separating said velocity reduction chamber from said deposition chamber; a drying device; and a heating device;
    b) a movable platen; and
    c) a plurality of substrate stations located on said movable platen;
    d) said movable platen oriented with respect to said predetermined sequence of said devices and said plurality of stations arranged on said movable platen so that each one of said plurality of stations simultaneously comes into the operational vicinity of a different one of said devices.

2. An apparatus as in claim 1 and further comprising a mist particle electrical acceleration system and wherein said mist showerhead comprises an electrode of a mist particle electrical acceleration system.

3. An apparatus as in claim 1 wherein said drying device comprises a heater, and said solidification device comprises a rapid thermal processing device.

4. An apparatus as in claim 1 wherein said predetermined sequence further comprises a pretreatment device before said deposition device.

5. An apparatus as in claim 1 wherein said predetermined sequence further comprises a cooling device.

6. An apparatus as in claim 5 wherein said cooling device is located after said rapid thermal processing device in said predetermined sequence.

7. An apparatus as in claim 1 and further including a loading/unloading device.

8. An apparatus as in claim 3 wherein said heater comprises a drying heater and a baking heater.

9. An apparatus as in claim 1 wherein said predetermined sequence of devices are arranged in a substantially circular predetermined sequence, said movable platen is substantially circular, and said stations are angularly distributed on said movable platen around the axis rotation of said movable platen.

10. An apparatus as in claim 9 and further including a drive motor for rotating said circular movable platen with respect to said predetermined sequence of devices.

11. An apparatus as in claim 1 wherein each of said plurality of stations further comprises a rotatable substrate holder.

12. An apparatus as in claim 1 wherein each of said plurality of stations includes an exhaust aperture.

13. An apparatus as in claim 12 wherein said deposition device comprises a misted deposition device, and said deposition device further includes a housing forming a deposition chamber in the operational vicinity of said deposition device, a showerhead for introducing said mist into said deposition chamber, and wherein said apparatus includes a vacuum pump in fluidic communication with each of said exhaust apertures.

14. An apparatus as in claim 1 and further including a vacuum chamber in which said devices and said movable platen are enclosed.

15. An apparatus as in claim 1 wherein said predetermined sequence of devices includes a plurality of deposition devices, an equal plurality of drying devices, and an equal plurality of heating devices, arranged in a periodic sequence with each of said drying devices following one of said deposition devices and each of said heating devices following one of said drying devices.

16. An apparatus as in claim 15 wherein each of said plurality of drying devices comprises a heater, and each of said plurality of solidification devices comprises a rapid thermal processing device.

17. An apparatus as in claim 15 wherein said periodic sequence further comprises an equal plurality of pretreatment devices, each placed in said periodic sequence before one of said deposition devices.

18. An apparatus as in claim 15 wherein said periodic sequence further comprises an equal plurality of cooling devices, each placed in said periodic sequence after one of said solidification devices.

19. An apparatus as in claim 15 wherein said periodic sequence comprises a plurality of substantially concentric rings, each of said rings a different distance from a common axis, each of said rings including one of said deposition devices, one of said drying devices, and one of said rapid thermal processing devices, said movable platen is substantially circular, and said stations are angularly distributed on said movable platen around the axis of rotation of said movable platen in a plurality of circles corresponding to said rings of said periodic sequence.

20. An apparatus as in claim 1 wherein said devices are arranged in a substantially linear predetermined sequence, said movable platen is substantially linear, and said stations are linearly distributed on said movable platen along the length of said movable platen.

* * * * *